United States Patent
Tian et al.

(10) Patent No.: US 12,089,503 B2
(45) Date of Patent: Sep. 10, 2024

(54) FERROMAGNETIC FREE LAYER, PREPARATION METHOD AND APPLICATION THEREOF

(71) Applicant: SHANDONG UNIVERSITY, Jinan (CN)

(72) Inventors: Yufeng Tian, Jinan (CN); Shishen Yan, Jinan (CN); Yanxue Chen, Jinan (CN); Lihui Bai, Jinan (CN); Qikun Huang, Jinan (CN)

(73) Assignee: Shandong University, Jinan (CN)

( * ) Notice: Subject to any disclaimer, the term of this patent is extended or adjusted under 35 U.S.C. 154(b) by 90 days.

(21) Appl. No.: 17/694,960

(22) Filed: Mar. 15, 2022

(65) Prior Publication Data

US 2023/0145391 A1 May 11, 2023

(30) Foreign Application Priority Data

Nov. 8, 2021 (CN) .......................... 202111312221.9

(51) Int. Cl.
| | |
|---|---|
| *G11C 11/10* | (2006.01) |
| *G11C 11/16* | (2006.01) |
| *H10B 61/00* | (2023.01) |
| *H10N 50/10* | (2023.01) |
| *H10N 50/85* | (2023.01) |
| *H10N 52/01* | (2023.01) |
| *H10N 52/80* | (2023.01) |

(52) U.S. Cl.
CPC ........... *H10N 50/10* (2023.02); *G11C 11/161* (2013.01); *H10B 61/00* (2023.02); *H10N 50/85* (2023.02); *H10N 52/01* (2023.02); *H10N 52/80* (2023.02)

(58) Field of Classification Search
CPC ........ H10N 50/10; H10N 50/85; H10N 52/01; H10N 52/80; H10N 50/01; G11C 11/161; G11C 11/18; G11C 11/1675; H10B 61/00; H01F 10/32
See application file for complete search history.

(56) References Cited

U.S. PATENT DOCUMENTS 9,853,205 B1 * 12/2017 Allenspach ............ H10N 50/10

* cited by examiner

Primary Examiner — Xiaochun L Chen
(74) Attorney, Agent, or Firm — Bold IP PLLC

(57) ABSTRACT

A ferromagnetic free layer, a preparation method and an application thereof are provided, where the ferromagnetic layer includes a magnetic film alloy, and the magnetic film alloy includes multiple layers of laminated films. A thickness of each of the films decreases gradually from a first end to a second end of the magnetic film alloy, so as to break in-plane structural symmetry of the magnetic film alloy, and the films include heavy metal films and ferromagnetic metal films, where out-of-plane crystal symmetry of the magnetic film alloy is broken by means of component gradients. When a current is applied in plane of the magnetic film alloy, a spin orbit torque will be generated, which directly drives the magnetic moment of the magnetic film alloy to undergo a deterministic magnetization reversal.

16 Claims, 3 Drawing Sheets

FERROMAGNETIC FREE LAYER, PREPARATION METHOD AND APPLICATION THEREOF

CROSS REFERENCE TO RELATED APPLICATION

This patent application claims the benefit and priority of Chinese Patent Application No. 202111312221.9 filed on Nov. 8, 2021, the disclosure of which is incorporated by reference herein in its entirety as part of the present application.

TECHNICAL FIELD

The present disclosure relates to the technical field of data storage, in particular to a ferromagnetic free layer, a preparation method and an application thereof.

BACKGROUND ART

In magnetic memories, magnetic tunnel junctions based on ferromagnetic pinned layers/oxides/ferromagnetic free layers have been widely used as storage units. The computer binary "0" and "1" correspond to two magnetization states of the ferromagnetic free layer. At present, the spin transfer torque and the spin orbit torque based on the spin current-driven magnetization reversal have been extensively studied. Compared with the spin transfer torque, the spin orbit torque can be designed as a three-terminal storage unit to separate the storage and reading paths of information and prolong the service life of the magnetic memories. However, the spin orbit torque usually needs to add an additional heavy metal layer on the magnetic tunnel junction to provide a spin current, and in order to ensure the deterministic reversal of the magnetic moment in the ferromagnetic free layer, the spin orbit torque also needs to apply an additional magnetic field along the direction of the current, thus the memories have a complex structure.

SUMMARY

An object of the present disclosure is to provide a ferromagnetic free layer, a preparation method and an application thereof. By changing the structure of the ferromagnetic free layer, the deterministic reversal of the magnetic moment driven by the spin orbit torque can be realized without adding an additional heavy metal layer in the magnetic tunnel junction or without the assistance of an additional magnetic field.

In order to achieve the above object, the present disclosure provides the following technical solution.

A ferromagnetic free layer is provided. The ferromagnetic free layer includes a magnetic film alloy; where the magnetic film alloy includes multiple layers of laminated films, and the thickness of each of the films decreases successively from a first end to a second end of the magnetic film alloy. The films include heavy metal films and ferromagnetic metal films, the heavy metal films and the ferromagnetic metal films are disposed alternatively. The thicknesses of the heavy metal films increase or decrease successively from a top layer to a bottom layer, and the thickness of each of the ferromagnetic metal films is the same or the thickness of each of the heavy metal films is the same, and the thicknesses of the ferromagnetic metal films increase or decrease successively from the top layer to the bottom layer or the thicknesses of the heavy metal films increase successively from the top layer to the bottom layer, and the thicknesses of the ferromagnetic metal films decrease successively from the top layer to the bottom layer or the thicknesses of the heavy metal films decrease successively from the top layer to the bottom layer, and the thicknesses of the ferromagnetic metal films increase successively from the top layer to the bottom layer.

A preparation method of a ferromagnetic free layer is provided, including the following steps.

Heavy metal films and ferromagnetic metal films are alternatively prepared in a misaligned growth method, such that the heavy metal films and the ferromagnetic metal films are laminated to obtain a ferromagnetic free layer, where the thicknesses of the heavy metal films increase or decrease successively from the top layer to the bottom layer, and the thickness of each of the ferromagnetic metal films is the same: or the thickness of each of the heavy metal films is the same, and the thicknesses of the ferromagnetic metal films increase or decrease successively from the top layer to the bottom layer: or, the thicknesses of the heavy metal films increase successively from the top layer to the bottom layer, and the thicknesses of the ferromagnetic metal films decrease successively from the top layer to the bottom layer: or, the thicknesses of the heavy metal films decrease successively from the top layer to the bottom layer, and the thicknesses of the ferromagnetic metal films increase successively from the top layer to the bottom layer.

A magnetic tunnel junction is provided, including a laminated ferromagnetic pinned layer, an oxide layer and a ferromagnetic free layer, where the ferromagnetic free layer is the above-mentioned ferromagnetic free layer.

A magnetic storage device is provided, including multiple storage units, where each of the storage units is the above-mentioned magnetic tunnel junction.

According to embodiments provided in the present disclosure, the present disclosure discloses technical effects as follows.

The present disclosure provides a ferromagnetic free layer, a preparation method and an application thereof, where the ferromagnetic free layer includes a magnetic film alloy, and the magnetic film alloy includes multiple layers of laminated films. The thickness of each of the films decreases gradually from the first end to the second end of the magnetic film alloy; so as to break an in plane structural symmetry of the magnetic film alloy, and each of the films includes heavy metal films and ferromagnetic metal films, where an out-of-plane crystal symmetry of the magnetic film alloy is broken by means of component gradient. When a current is applied to an in plane of the magnetic film alloy, a spin orbit torque will be generated, which directly drives the magnetic moment of the magnetic film alloy to undergo a deterministic magnetization reversal. The magnetic film alloy is used as a ferromagnetic free layer, the deterministic reversal of the magnetic moment driven by the spin orbit torque can be realized without adding an additional heavy metal layer in the magnetic tunnel junction or without the assistance of an additional magnetic field. The present disclosure can simplify the structure of the magnetic tunnel junctions and the magnetic memories, and has great practical application value in the preparation and design of high-density, low-power magnetic memories.

DETAILED DESCRIPTION OF THE EMBODIMENTS

In order to make the object, characteristics and advantage of the present disclosure more clear, the present disclosure is further illustrated in detail in combination with the accompanying drawings and embodiments hereinafter.

Example 1

Figure 1A:
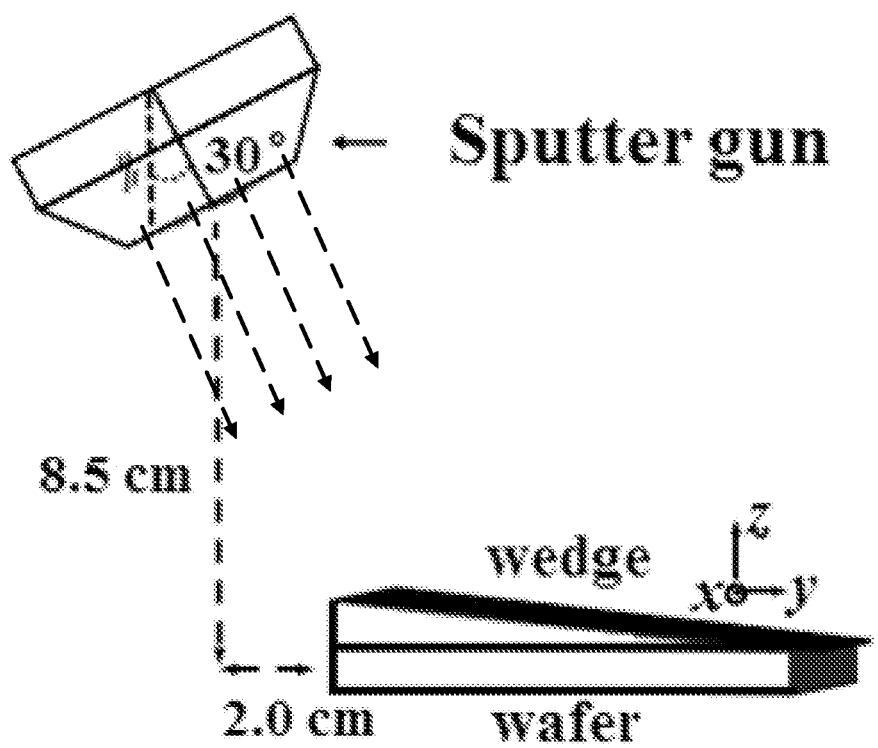
FIG. 1A is a schematic diagram illustrating a process of obliquely sputtering a CoPt magnetic film alloy by using a magnetron sputtering apparatus according to Embodiment 1 of the present disclosure.
Figure 1B:
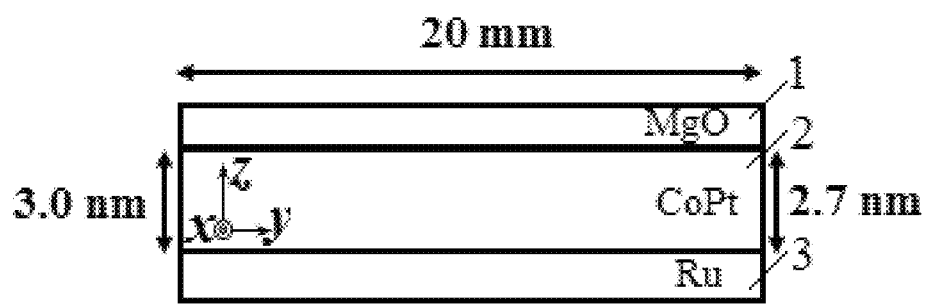
FIG. 1B is a schematic structural diagram of an actually prepared ferromagnetic free layer according to Embodiment 1 of the present disclosure.
Figure 1C:
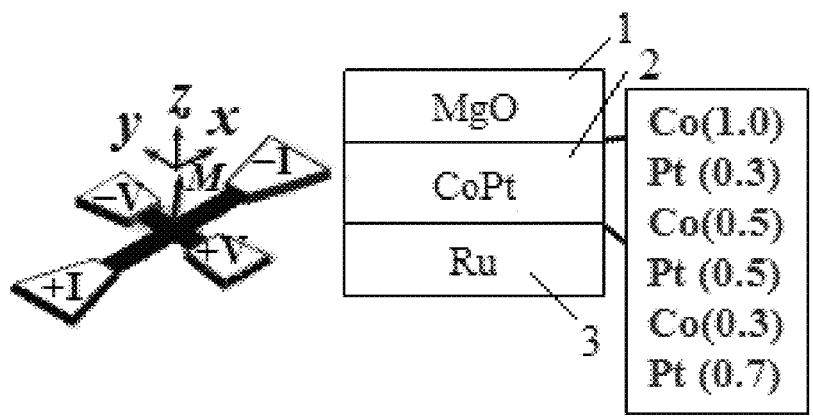
FIG. 1C is a schematic structural diagram of a ferromagnetic free layer with the CoPt layer having a nominal thickness according to Embodiment 1 of the present disclosure.

The present example provides a ferromagnetic free layer. As shown in FIGS. 1A to 1C, the ferromagnetic free layer includes a magnetic film alloy 2, and the magnetic film alloy 2 includes multiple layers of laminated films stacked on top of each other. The thickness of each of the films decreases gradually from a first end to a second end of the magnetic film alloy 2, that is, each of the films is wedge-shaped. As shown in FIG. 1A, it is a schematic diagram showing a structure having a layer of film deposited on a substrate. In FIG. 1A, a y-axis direction is a direction from a first end to a second end of the magnetic film alloy 2, and a thickness of each of the films decreases gradually along the y-axis direction. It should be noted that a length (along the y-axis direction) and a width (along an x-axis direction) of each of the films are the same, and then the first end of the magnetic film alloy 2 is a first end of each of the films, and the second end of the magnetic film alloy is a second end of each of the films.

Each of the films can prepared in an oblique growth manner, and the thickness of each of the films decreases gradually along the y-axis direction, thereby breaking the in plane structural symmetry of the magnetic film alloy 2 by the oblique growth manner.

The films include heavy metal films and ferromagnetic metal films, and the heavy metal films and the ferromagnetic metal films are alternatively disposed. Materials for the heavy metal films include Platinum (Pt), Tantalum (Ta), Terbium (Tb), and Tungsten (W), and materials for the ferromagnetic metal films include Ferrum (Fe), Cobalt (Co), and Nickel (Ni). Then, types of the magnetic film alloy 2 include, but are not limited to, Cobalt and Platinum (CoPt), Ferrum and Platinum (FePt), and Cobalt and Terbium (CoTb). In addition, the thicknesses of the heavy metal films increase or decrease successively from a top layer to a bottom layer, and the thickness of each of the ferromagnetic metal films is the same. Alternatively, the thickness of each of the heavy metal films is the same, and the thicknesses of the ferromagnetic metal films increase or decrease successively from the top layer to the bottom layer. Alternatively, the thicknesses of the heavy metal films increase successively from the top layer to the bottom layer, and the thicknesses of the ferromagnetic metal films decrease successively from the top layer to the bottom layer. Alternatively, the thicknesses of the heavy metal films decrease successively from the top layer to the bottom layer, and the thicknesses of the ferromagnetic metal films increase successively from the top layer to the bottom layer. Thereby, the out-of-plane crystal symmetry of the magnetic film alloy 2 is broken by means of component gradient.

A current is applied in plane of the magnetic film alloy 2, and a direction of the current is perpendicular to the direction from the first end to the second end and parallel to the horizontal plane, that is, the current is applied along the x-axis shown in FIG. 1A, and the spin orbit torque is generated by the current. Since both the in-plane symmetry and the out-of-plane symmetry of the magnetic film alloy 2 are broken, the spin orbit torque can realize the deterministic magnetization reversal of the magnetic moment of the magnetic film alloy 2. When the magnetic film alloy 2 is used as a ferromagnetic free layer in the magnetic tunnel junction, since the ferromagnetic free layer can realize the deterministic magnetization reversal of the magnetic moment under the drive of a pure current, there is no need to add an additional heavy metal layer in the magnetic tunnel junction or no demand for the assistance of an additional magnetic field, which can simplify the structure of the magnetic tunnel junctions and the magnetic memories, and has great practical application value in the preparation and design of high-density; low-power magnetic memories.

As an optional implementation manner, the ferromagnetic free layer of this example further includes a buffer layer 3 and a coating protection layer 1, where the buffer layer 3 is provided below the magnetic film alloy 2, and the coating protection layer 1 is provided above the magnetic film alloy 2, so that the buffer layer 3 and the coating protection layer 1 can be configured to protect the magnetic film alloy 2. As shown in FIGS. 1B and 1C, it is a schematic structural diagram of a ferromagnetic free layer including a buffer layer 3, a magnetic film alloy 2 and a coating protection layer 1. The buffer layer 3 is a Ruthenium (Ru) layer, and the coating protection layer 1 is a Magnesium oxide (MgO) layer.

Hereinafter, specific experiments are carried out to prove effects of the above-mentioned ferromagnetic free layer:

FIG. 1A is a schematic diagram illustrating a process of obliquely sputtering a CoPt magnetic film alloy 2 by using a magnetron sputtering apparatus. As shown in FIG. 1A, the rotation function of the substrate itself is turned off and the substrate can be translated along the y-axis, which causes the target atoms to obliquely incident on the substrate, resulting in each film being a wedge-shaped film. Meanwhile, Co and Pt are alternatively sputtered to prepare a CoPt magnetic film alloy 2.

FIG. 1C shows a designed Ru (2.0 nm)/CoPt/MgO (2.0 nm) ferromagnetic free layer, in which the CoPt layer has a nominal thickness of 3.3 nm, and FIG. 1B shows a prepared ferromagnetic free layer actually prepared with a CoPt layer of a thickness of 3.0 nm on one end and a thickness of 2.7 nm on the other end, in which Ru and MgO layers are used as a buffer layer 3 and a coating protection layer 1 respectively. The CoPt magnetic film alloy 2 has a structure of Pt (0.7 nm)/Co (0.3 nm)/Pt (0.5 nm)/Co (0.5 nm)/Pt (0.3 nm)/Co (1.0 nm), where these thickness values are nominal thickness values set in design. The metal layers Ru. Pt and Co are produced by direct current (DC) sputtering with a growth rate of 0.1422 Å per second, 0.0556 Å per second and 0.1923 Å per second respectively. MgO is produced by radio frequency (RF) sputtering, with a growth rate of 0.0392 Å per second. The thickness of each film can be determined by setting the sputtering time. The background vacuum pressure of the chamber before pre sputtering is better than $10^{-8}$ Torr, and the argon pressure during sputtering is 3 mTorr. In addition, the thickness of the CoPt magnetic film alloy 2 measured by X-ray reflectivity is marked in FIG. 1B, and the result shows that the thickness gradient caused by oblique sputtering is only 0.015 nm/mm.

The anomalous Hall effect is a means for experimentally characterizing the magnetic moment state of magnetic film alloys 2. Here, a Hall bar structure with a width of 5 µm and a length of 80 µm is fabricated of a CoPt magnetic film alloy by using photolithography and argon ion etching. The Hall bar structure and the test wiring of the abnormal Hall effect are shown in FIG. 1C, where a current runs along the x-axis and the Hall voltage is measured along the y-axis. In the experiment, a Keithley 6221 current source is configured to apply a pulse current along the positive or negative direction of the x-axis, and a pulse width of the pulse current is 10 ms.

Figure 2:
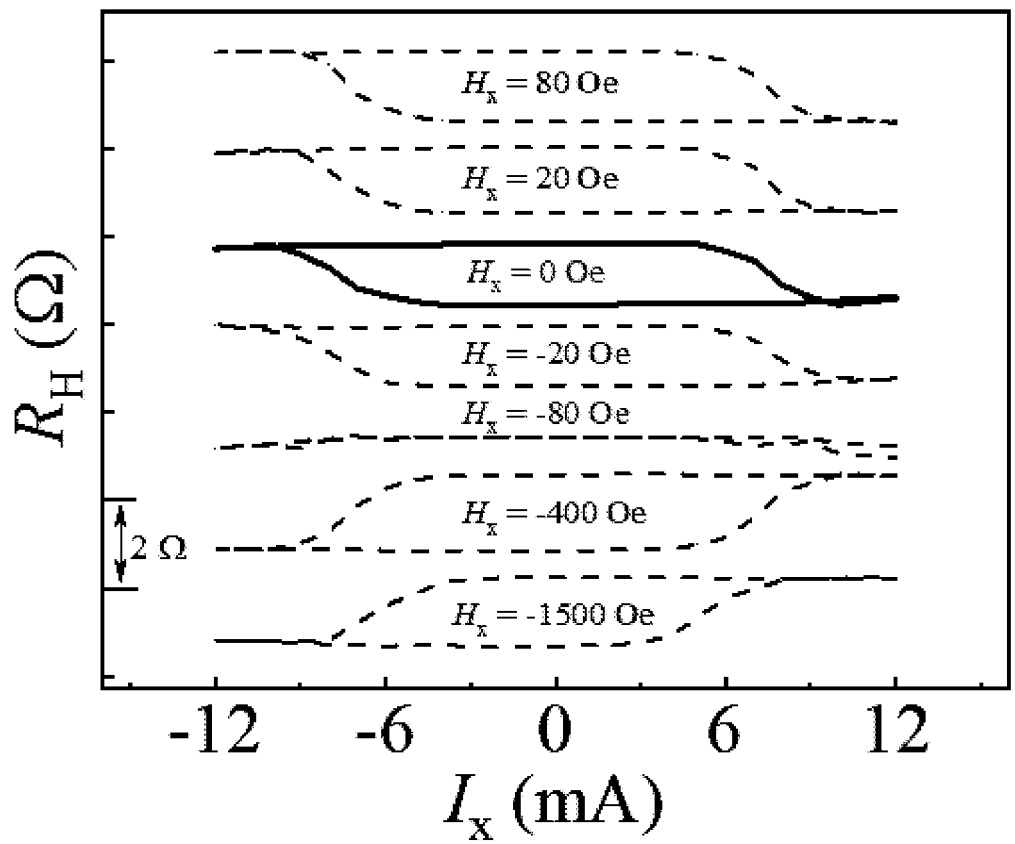
FIG. 2 is a schematic diagram illustrating a hysteresis loop of anomalous Hall resistance (RH) and pulse current Ix under an action of different external magnetic fields Hx according to Embodiment 1 of the present disclosure.

FIG. 2 shows a hysteresis loop of an anomalous Hall resistance (RH) and a pulse current Ix under the action of different external magnetic fields Hx, where in a low-resistance state, the magnetic moment is in a downward direction: and in a high-resistance state, the magnetic moment is in an upward direction. The loop in FIG. 2 is measured by first applying a corresponding amplitude pulse current Ix (with a pulse width of 10 ms) to generate a spin orbit torque so as to drive the magnetic moment reversal, and then measuring the anomalous Hall resistance (RH), i.e., the state of the magnetic moment, with a small current of 0.1 mA. It can be seen from FIG. 2 that even without the assistance of magnetic field, that is, Hx=0, the positive current causes the magnetic moment to reverse downward, while the negative current causes the magnetic moment to reverse upward. Therefore, the experimental results prove that the symmetry-broken CoPt magnetic film alloy 2 prepared in this example can realize the deterministic reversal of the magnetic moment driven by pure current without an additional heavy metal layer and without the assistance of a magnetic field.

Figure 3:
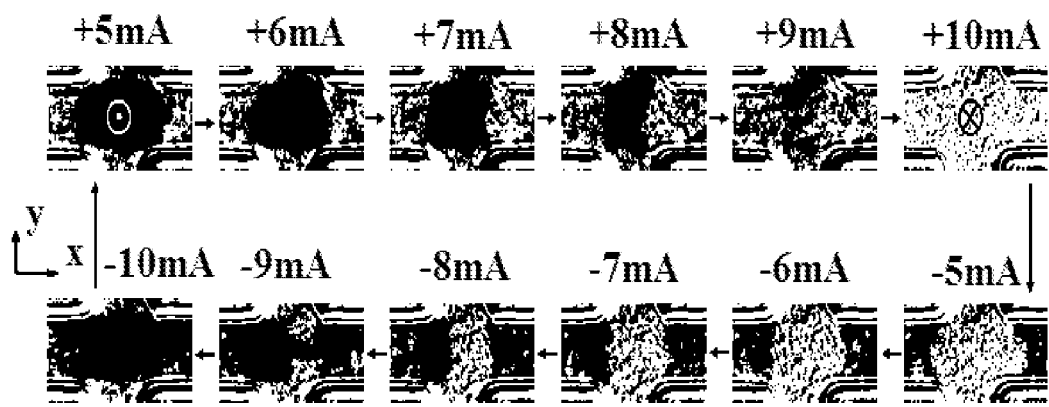
FIG. 3 is images of current-driven magnetic domain reversal under zero magnetic field according to Embodiment 1 of the present disclosure.

FIG. 3 shows the measurement of magneto-optical Kerr effect, which shows the evolution process of the nucleation and expansion of the reverse magnetic domain in the CoPt magnetic film alloy 2 stimulated by the pulse current with different amplitudes. In FIG. 3, the gray area represents the magnetic moment along the −z direction, and the black area represents the magnetic moment along the +z direction. It can be seen that as the amplitude of the positive current increases, the area of the black area in the CoPt magnetic film alloy 2 decreases, and the area of the gray area increases, that is, the magnetic moment along the +z direction gradually reverses to the −z direction under the action of the positive current. Instead, the negative current causes the gray area to decrease and the black area to increase, that is, the negative current causes the magnetic moment to reverse to the +z direction, and the result is consistent with the result of the Hall resistance measurement in FIG. 2.

This example proposes a ferromagnetic free layer structure that does not rely on an additional heavy metal layer and the assistance of an additional magnetic field, and realizes the deterministic magnetization reversal of the magnetic moment in the ferromagnetic free layer driven by the spin orbit torque through a pure current. The principle of the structure is to break the in-plane symmetry and out-of-plane symmetry of the magnetic film alloy 2 at the same time. The term "in-plane" refers to the same horizontal plane, e.g., an x-y plane as shown in FIGS. 1A to 1C. The in-plane direction can generally be divided into orthogonal x-axis and y-axis directions, which can be broken in one direction of the x-axis and y-axis directions in the plane, such as in the x-axis direction or y-axis direction, or can be broken in two orthogonal directions in the plane, such as both the x-axis direction and y-axis direction. The term "out-of-plane" refers to the direction parallel to the normal of the horizontal plane, e.g., the z-axis, as shown in FIGS. 1A to 1C. Symmetry includes but not limited to structural symmetry, lattice symmetry, etc. This example realizes the deterministic regulation on the direction of the magnetic moment in the magnetic film alloy 2 via the spin orbit torque, by combining the oblique growth method and the component gradient.

Example 2

This example is to provide a preparation method of a ferromagnetic free layer, including: alternatively preparing heavy metal films and ferromagnetic metal films by a misaligned growth method, the heavy metal films and the ferromagnetic metal films are laminated to obtain the ferromagnetic free layer. The thicknesses of the heavy metal films increase or decrease successively from the top layer to the bottom layer, and the thickness of each of the ferromagnetic metal films is the same. Alternatively, the thickness of each of the heavy metal films is the same, and the thicknesses of the ferromagnetic metal films increase or decrease successively from the top layer to the bottom layer. Alternatively, the thicknesses of the heavy metal films increase successively from the top layer to the bottom layer, and the thicknesses of the ferromagnetic metal films decrease successively from the top layer to the bottom layer. Alternatively, the thicknesses of the heavy metal films decrease successively from the top layer to the bottom layer, and the thicknesses of the ferromagnetic metal films increase successively from the top layer to the bottom layer.

As an optional implementation manner, the misaligned growth method includes pulsed laser deposition, magnetron sputtering, electron beam evaporation and molecular beam epitaxy: It should be noted that the misaligned growth method means that the target material is incident and deposited on the surface of the substrate to be coated at a small inclination to the substrate surface to grow a wedge-shaped film.

Next, the process of preparing the CoPt magnetic film alloy 2 by using the misaligned growth method with a magnetron sputtering apparatus will be described.

In step (1), the Silicon (Si)/Silicon dioxide ($SiO_2$) substrate of (001) orientation is fixed on a sample holder that can move three-dimensionally.

In step (2), the position of the sample holder is adjusted to make the substrate deviate from the sputtering center area of the target material to form a certain oblique incidence angle, and films with different oblique angles can be prepared by changing the position of the substrate. Meanwhile, a relatively simple method for the preparation of the CoPt magnetic film alloy 2 is to alternatively sputter Pt and Co components, and adjust the sputtering time to make the Pt and/or Co components have a thickness gradient. The thickness gradient means that the thickness of two components gradually increases or decreases from the bottom layer to the top layer.

The magnetic film alloy 2 with an out-of-plane component gradient and vertical magnetic anisotropy is obliquely grown by misaligned growth methods such as pulsed laser deposition, magnetron sputtering, electron beam evaporation and molecular beam epitaxy. Due to the misaligned growth method, the thickness of the film is uneven, the thickness is thicker where the inclination angle is small, and the thickness is thinner where the inclination angle is large, forming a wedge structure, therefore, the in-plane structural symmetry is broken. The alternate and oblique growing and the thickness gradient of the film, results in a component gradient in the out-of-plane direction, thus the out-of-plane crystal symmetry is also broken. A current is applied in the plane of the magnetic film alloy 2 to drive the magnetic moment reversal, where the current direction is perpendicular to the direction along which the in-plane symmetry in the film is broken.

This example provides a preparation method of a single magnetic layer capable of magnetic moment reversal driven by a current without an additional heavy metal layer and without the assistance of an additional magnetic field. The method has great practical application value in the preparation and design of high-density and low-power magnetic memories, and has the advantages of strong universality and easy preparation.

Example 3

The present example is to provide a magnetic tunnel junction, including a laminated ferromagnetic pinned layer, an oxide layer and a ferromagnetic free layer, where the ferromagnetic free layer is the ferromagnetic free layer as described in Example 1.

Example 4

A magnetic memory is provided, including multiple storage units, where each of the storage units is the magnetic tunnel junction as described in Example 3.

The foregoing illustration of the examples is only to help in understanding the method and the core idea of the present disclosure. Meanwhile, for those skilled in the art, there will be changes in the embodiments and application scope according to the idea of the disclosure. In a word, the contents of the present disclosure should not be constructed as a limit to the present invention.

What is claimed is:

1. A ferromagnetic free layer, comprising a magnetic film alloy, wherein the magnetic film alloy have a first horizontal direction y and a second horizontal direction x perpendicular to the first horizontal direction y and comprises a plurality of layers of films laminated in a vertical direction z, which is perpendicular to the first horizontal direction y and the second horizontal direction x, and a thickness of each of the films decreases gradually from a first end to a second end of the magnetic film alloy in the first horizontal direction y; the films include heavy metal films and ferromagnetic metal films, the heavy metal films and the ferromagnetic metal films are disposed alternatively; thicknesses of the heavy metal films at a same cross section of the ferromagnetic free layer, which is taken parallel to x-z plane at any position of the ferromagnetic free layer, increase or decrease successively from a top layer to a bottom layer, and a thickness of each of the ferromagnetic metal films at the same cross section is the same; or, a thickness of each of the heavy metal films at the same cross section is the same, and thicknesses of the ferromagnetic metal films at the same cross section increase or decrease successively from a top layer to a bottom layer; or, the thicknesses of the heavy metal films at the same cross section increase successively from the top layer to the bottom layer, and the thicknesses of the ferromagnetic metal films at the same cross section decrease successively from the top layer to the bottom layer; or, the thicknesses of the heavy metal films at the same cross section decrease successively from the top layer to the bottom layer, and the thicknesses of the ferromagnetic metal films at the same cross section increase successively from the top layer to the bottom layer, wherein each of the films is formed through obliquely sputtering for predetermined sputtering times by a magnetron sputtering apparatus arranged at a predetermined oblique angle.

2. The ferromagnetic free layer according to claim 1, wherein a current is applied in plane of the magnetic film alloy, and a direction of the current is perpendicular to a direction from the first end to the second end and parallel to a horizontal plane x-y.

3. The ferromagnetic free layer according to claim 1, wherein the ferromagnetic free layer further comprises a buffer layer and a coating protection layer, the buffer layer is provided below the magnetic film alloy and the coating protection layer is provided above the magnetic film alloy.

4. The ferromagnetic free layer according to claim 1, wherein materials for the heavy metal films comprise Platinum (Pt), Tantalum (Ta), Terbium (Tb) and Tungsten (W).

5. The ferromagnetic free layer according to claim 1, wherein materials for the ferromagnetic metal films comprise Ferrum (Fe), Cobalt (Co) and Nickel (Ni).

6. The ferromagnetic free layer according to claim 3, wherein the buffer layer is a Ruthenium (Ru) layer, and the coating protection layer is a Magnesium oxide (MgO) layer.

7. The ferromagnetic free layer of claim 1, wherein the ferromagnetic free layer is included in a magnetic tunnel junction, wherein the magnetic tunnel junction further comprises a laminated ferromagnetic pinned layer and an oxide layer.

8. The ferromagnetic free layer of claim 7, wherein a current is applied in plane of a magnetic film alloy, and a direction of the current is perpendicular to a direction from a first end to a second end and parallel to a horizontal plane.

9. The ferromagnetic free layer of claim 7, wherein the ferromagnetic free layer further comprises a buffer layer and a coating protection layer, the buffer layer is provided below the magnetic film alloy and the coating protection layer is provided above the magnetic film alloy.

10. The ferromagnetic free layer of claim 7, wherein materials for heavy metal films comprise Pt, Ta, Tb and W.

11. The ferromagnetic free layer of claim 7, wherein materials for ferromagnetic metal films comprise Fe, Co and Ni.

12. The ferromagnetic free layer of claim 7, wherein a buffer layer is a Ru layer, and a coating protection layer is a MgO layer.

13. The ferromagnetic free layer of claim 7 further comprising a magnetic memory, comprising a plurality of storage units, wherein each of the storage units is the magnetic tunnel junction.

14. A preparation method of a ferromagnetic free layer, comprising:
    alternatively preparing heavy metal films and ferromagnetic metal films in a misaligned growth method, such that the heavy metal films and the ferromagnetic metal films are laminated in a vertical direction z and to obtain a ferromagnetic free layer with a first horizontal direction y and a second horizontal direction x perpendicular to the first horizontal direction y, wherein a thickness of each of the films decreases gradually from a first end to a second end of the magnetic film alloy in the first horizontal direction y, thicknesses of the heavy metal films at a same cross section of the ferromagnetic free layer, which is taken parallel to x-z plane at any position of the ferromagnetic free layer, increase or decrease successively from a top layer to a bottom layer, and a thickness of each of the ferromagnetic metal films at the same cross section is the same; or, a thickness of each of the heavy metal films at the same cross section is the same, and thicknesses of the ferromagnetic metal films at the same cross section increase or decrease successively from the top layer to the bottom layer; or, the thicknesses of the heavy metal films at the same cross section increase successively from the top layer to the bottom layer, and the thicknesses of the ferromagnetic metal films at the same cross section decrease successively from the top layer to the bottom layer; or, the thicknesses of the heavy metal films at the same cross section decrease successively from the top layer to the bottom layer, and the thicknesses of the ferromagnetic metal films at the same cross section increase successively from the top layer to the bottom layer, wherein each of the ferromagnetic metal films and the heavy metal films is formed through obliquely sputtering for predetermined sputtering times by a magnetron sputtering apparatus arranged at a predetermined oblique angle.

15. The preparation method according to claim 14, wherein the misaligned growth method comprises pulsed laser deposition, magnetron sputtering, electron beam evaporation and molecular beam epitaxy.

16. A ferromagnetic free layer, comprising a magnetic film alloy, wherein the magnetic film alloy comprises a plurality layers of laminated films, which are formed through obliquely sputtering for respective sputtering times by a magnetron sputtering apparatus arranged at a predetermined oblique angle so that a thickness of each of the films decreases gradually from a first end to a second end of the magnetic film alloy; the films comprise heavy metal films and ferromagnetic metal films, the heavy metal films and the ferromagnetic metal films are disposed alternatively; sputtering times of the heavy metal films increase or decrease successively from a top layer to a bottom layer, and sputtering times of ferromagnetic metal films are the same; or, the sputtering times of the heavy metal films are the same, and the sputtering times of the ferromagnetic metal films increase or decrease successively from a top layer to a bottom layer; or, the sputtering times of the heavy metal films increase successively from the top layer to the bottom layer, and the sputtering times of the ferromagnetic metal films decrease successively from the top layer to the bottom layer; or, the sputtering times of the heavy metal films decrease successively from the top layer to the bottom layer, and the sputtering times of the ferromagnetic metal films increase successively from the top layer to the bottom layer.

* * * * *